United States Patent [19]

Gold

[11] Patent Number: 4,575,680

[45] Date of Patent: Mar. 11, 1986

[54] BATTERY CONDITION INDICATOR AND ON-OFF RELAY CIRCUIT

[76] Inventor: Kenneth S. Gold, 7721 Nevada Ave., Canoga Park, Calif. 91304

[21] Appl. No.: 485,879

[22] Filed: Apr. 18, 1983

[51] Int. Cl.$^4$ ............................................. G01N 27/46
[52] U.S. Cl. .................................. 324/433; 324/435; 340/636
[58] Field of Search ............... 324/426, 429, 433, 133, 324/434, 435; 340/636, 660, 661, 662, 663, 43; 320/13, 37, 48, 38; 307/141

[56] References Cited

U.S. PATENT DOCUMENTS

| | | | |
|---|---|---|---|
| 3,810,144 | 5/1974 | Clouse | 340/248 L |
| 3,879,137 | 4/1975 | Sakazaki | 356/218 |
| 3,886,443 | 5/1975 | Miyakawa | 324/29.5 |
| 3,997,831 | 12/1976 | Hopfner | 320/48 |
| 4,028,616 | 6/1977 | Stevens | 324/29.5 |
| 4,251,811 | 2/1981 | Wittlinger | 324/435 |
| 4,338,596 | 7/1982 | Huber | 340/636 |

FOREIGN PATENT DOCUMENTS 24960 of 1913 United Kingdom ................ 324/435

Primary Examiner—Reinhard J. Eisenzopf
Assistant Examiner—Kevin D. O'Shea
Attorney, Agent, or Firm—J. E. McTaggart

[57] ABSTRACT

A battery condition indicator and on-off relay circuit for electric guitars with on-board active electronics, adaptable to many other battery-operated appliances, includes an electronic relay circuit capable of disconnecting one or more batteries, under control of a pair of on-off contacts. A test interval timing circuit delays turnoff by about 10 seconds, during which a test of the battery (or batteries) is performed automatically under normal load by comparison to a precision reference voltage. Good battery condition is indicated by illumination of a light-emitting diode which may be located inside the guitar body, visible thru the opening of a standard audio output jack, which may include the on-off contacts, actuated by insertion or removal of the mating audio output plug. The circuit is particularly power-efficient to minimize battery drain.

15 Claims, 2 Drawing Figures 4,575,680

BATTERY CONDITION INDICATOR AND ON-OFF RELAY CIRCUIT

BACKGROUND OF THE INVENTION

The present invention relates to the field of portable appliances operated from batteries, and more particularly to the field of electronic musical instruments such as electric guitars. While the great majority of guitars have been fitted with only passive electronic circuits, there has been a trend to incorporate active on-board battery-powered preamplifiers and audio processors to overcome the shortcomings and performance compromises inherent in passive guitar electronics. This trend, as part of a general proliferation of battery-operated appliances, has created requirements, heretofore unsatisfied, for positive, accurate and convenient determination and indication of battery condition.

One solution sometimes found on scientific instruments and the like has been the use of a built-in analog or digital voltmeter, operable by a selector switch or pushbutton. However such a solution is unnecessarily costly, complex, inconvenient and confusing to non-technical users such as musicians. Other known battery-testing schemes often conflict with aesthetics, particularly in retrofitting an existing product design, where styling constraints may be imposed precluding drilling the enclosure or adding exterior fittings of any kind, ruling out the use of known systems requiring switches, pushbuttons or exterior-mounted indicators. Known battery-testing schemes requiring manual operation of pushbuttons or switches tend to be disregarded by the user because of the inconvenience of having to perform the test; consequently, unexpected battery failures are not uncommon.

Needs have developed for indicating the condition of a pair of batteries used in a dual power supply configuration, and for disconnecting both of them from their loads, controlled by a single pair of contacts, which may be part of an audio jack mounted on an electric guitar, where the contacts are actuated by removal of the plug of an audio cable from the jack.

OBJECTS OF THE INVENTION

Accordingly it is a primary object of this invention to provide an electronic circuit for indicating the condition of a battery to warn the user that the battery is nearing the end of its useful charge or life expectancy.

It is a further object of this invention to provide a battery condition indicator for a pair of batteries in a dual power supply circuit.

It is a further object of this invention to provide, in an electronics package for installation into an electric guitar body, a dual-battery condition indication system in which removal of an audio plug from a jack in the guitar body initiates a brief test period, during which acceptable voltage level under normal load is indicated by illumination of a light emitting diode, followed by automatic shutoff of both batteries.

It is still a further object of this invention to provide, for electric guitars with active electronics, an automatic battery condition indicator system which can be readily installed into the guitar body without drilling or otherwise altering the style and appearance of the guitar.

DETAILED DESCRIPTION OF THE PREFERRED EMBODIMENT

Figure 1:
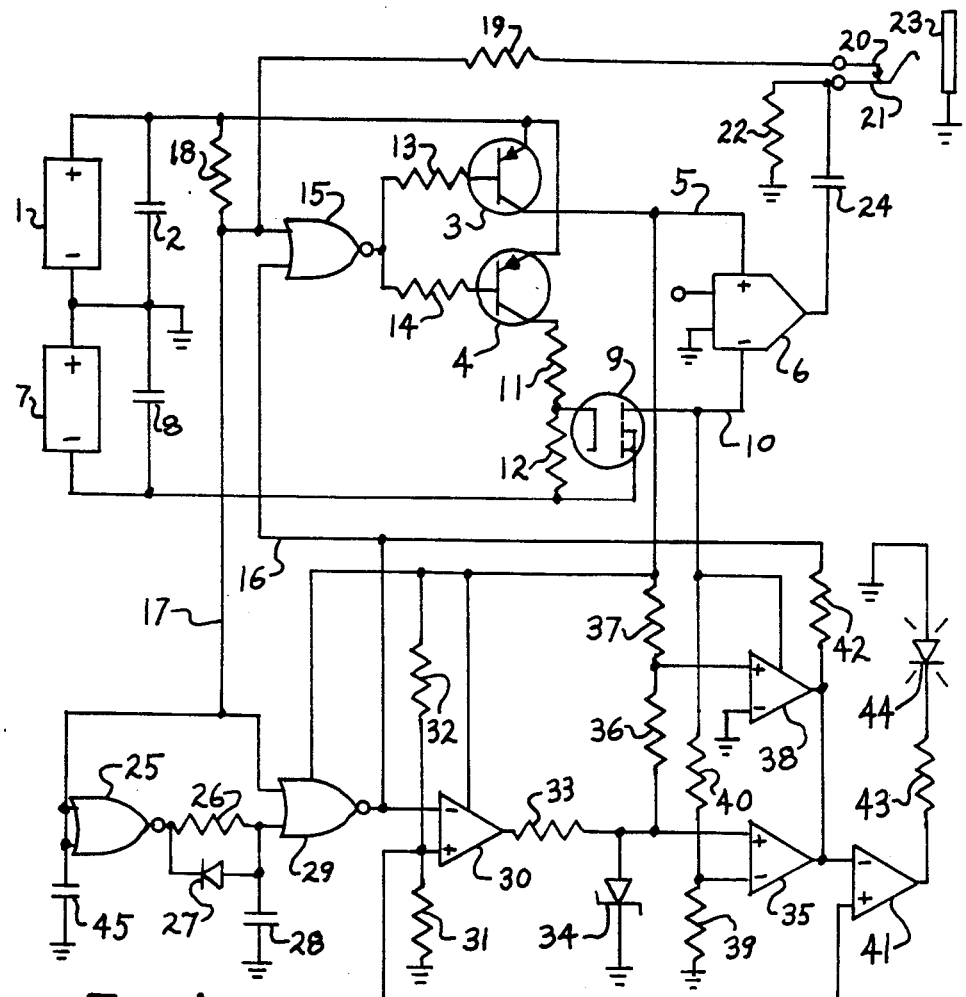
FIG. 1 is a circuit diagram of a battery condition indicator and on-off relay circuit in a preferred embodiment of this invention as applied to a dual battery power supply for an on-board guitar preamplifier.

With reference to FIG. 1, a first 9 volt battery 1, in parallel with capacitor 2, has its negative terminal connected to common ground and its positive terminal connected to the emitters of PNP power switching transistors 3 and 4. The collector of transistor 3 is connected to the positive supply buss 5 which is connected to the positive power input terminal of on-board guitar preamplifier 6.

A second 9 volt battery 7, in parallel with capacitor 8, has its positive terminal connected to common ground and its negative terminal connected to the source of field-effect transistor (FET) 9. The drain of FET 9 is connected to the negative supply buss 10 which is connected to the negative power input terminal of the preamplifier 6. The gate of FET 9 is connected thru resistor 11 to the collector of transistor 4, and thru resistor 12 to the negative terminal of battery 7.

The bases of transistors 3 and 4 are connected thru resistors 13 and 14 respectively to the output of NOR gate 15, which has one input connected to timing interval buss 16, and its other input connected to on-off buss 17, which is connected thru resistor 18 to the positive terminal of battery 1 and thru resistor 19 to switch contact 20, engaging contact 21 which is connected thru resistor 22 to ground. Contact 21 also forms the tip contact of audio output jack 23, and is connected thru coupling capacitor 24 to the output of preamplifier 6.

On-off buss 17, connected thru capacitor 45 to ground, is also connected to the input of inverter 25, whose output is connected thru resistor 26 and diode 27, in parallel with each other, thru capacitor 28 to ground. The junction of resistor 26, diode 27 and capacitor 28 is also connected to an input of NOR gate 29 which has its other input connected to the on-off buss 17 and its output connected to the test interval buss 16 and to the inverting input of comparator 30. The non-inverting input of comparator 30 is connected to the tap of a voltage divider formed by resistor 31 connected to ground and resistor 32 connected to the positive supply buss 5. The output of comparator 30 is connected thru resistor 33 and 2.5 volt reference device 34 in series to ground. The junction of resistor 33 and reference device 34 is connected to the non-inverting input of comparator 35, and thru resistor 36 in series with resistor 37 to the positive supply buss 5. The junction of resistors 36 and 37 is connected to the non-inverting input of comparator 38 whose inverting input is grounded.

The inverting input of comparator 35 is connected to the tap of a voltage divider formed by resistor 39 to ground and resistor 40 to the negative supply rail 10.

The outputs of comparators 35 and 38, connected together, are connected to the inverting input of comparator 41 thru resistor 42 to the test interval buss 16. Comparator 41 has its non-inverting input connected to the junction of resistors 31 and 32, and its output connected thru resistor 43 and light-emitting diode (LED) 44 to ground.

Figure 2:
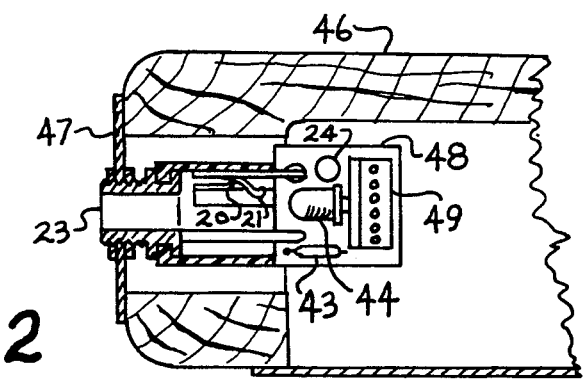
FIG. 2 is a cross-sectional view of a portion of a guitar body showing a battery condition indication light-emitting diode located so as to be visible through the audio jack when the plug is removed, according to an embodiment of this invention.

FIG. 2 shows a cross-sectional view of a portion of a guitar body 46 fitted with a metal plate 47 having a hole in which audio output jack 23 is mounted. Jack 23 contains switch contact 20 and combined switch and tip contact 21. Attached to jack 23 is circuit board 48 on which are mounted capacitor 24, LED 44, resistor 22 and connector 49.

OPERATION OF THE PREFERRED EMBODIMENT

Referring once more to FIG. 1; to initiate operation of preamplifier 6, an audio plug (not shown) is inserted into jack 23, causing contacts 20 and 21 to become open-circuited. Resistor 22, having 100k ohms resistance, has negligible shunting effect on the low impedance output of preamplifier 6. Resistor 18, 10 megohms, places a "high" state (near +9 volts) on the on-off buss 17, which makes the output of inverter 25 "low" (near 0 volts), holding capacitor 28 discharged. The on-off buss "high" on one input of NOR gate 29 causes its output and test interval buss 16 to be "low". This "low" is applied thru resistor 42 to the inverting input of comparator 41 while its non-inverting input is held near +4.5 volts by resistors 31 and 32, each 220k ohms; therefore the output of comparator 41 is an open collector, holding LED 44 off at all times during normal operation of preamplifier 6.

Also, during normal operation, the "low" on the test interval buss 16, applied to the inverting input of comparator 30, with approximately +4.5 volts on its non-inverting input from resistors 31 and 32, causes its output to become an open collector, zero-biasing reference circuit 34 to avoid waste current drain during normal operation of preamplifier 6.

At turnoff, audio plug removal from jack 23 causes contacts 20 and 21 to close. The resultant "low" at the input of inverter 25 drives its output "high", initiating charging of capacitor 28 thru resistor 26. Diode 27, being reverse biased, has no effect in this mode.

At the instant of turnoff, as the on-off buss 17 goes "low", both inputs of NOR gate 29 become "low", driving its output "high". This "high" on the test interval buss 16 holds the output of NOR gate 15 "low", delaying the turnoff of supply voltages on rails 5 and 10, while capacitor 28 charges with a time constant of approximately 10 seconds as determined by the capacitance of capacitor 28 (10 uF) and the resistance of resistor 26 (1 megohm).

During the test interval, batteries 1 and 7 are both tested as follows: the "high" on the test interval buss 16 enables comparators 35 and 38 thru resistor 42. With the reference voltage at −2.5 volts from reference device 34, the resistance values of resistors 36 and 37, 110k ohms and 220k ohms respectively, cause the threshold of comparator 38 to correspond with +5 volts on supply rail 5. Above +5 volts the output of comparator 38 remains an open circuit. Similarly, the resistance values of resistors 39 and 40, each 220k ohms, cause the threshold of comparator 35 to correspond with −5 volts on rail 10. When the negative voltage on rail 10 exceeds 5 volts, the output of comparator 35 remains an open circuit.

When the outputs of comparators 35 and 38 are both open circuits, resistor 42 applies the test interval "high" to the inverting input of comparator 41, driving its output to near −9 volts, holding LED 44 on, indicating that the voltages of batteries 1 and 7 both exceed a threshold level of 5.1 volts, considering the voltage drop across transistor 3 and FET 9 is about 0.1 volt for each.

If the voltage of either battery 1 or battery 7 is below 5.1 volts during the test interval, the output of comparator 38 or 35 respectively will "pull down" driving the output of comparator 41 positive, holding LED 44 off, indicating that at least one of the two batteries 1 or 7 has failed the voltage test.

The end of the test interval occurs when capacitor 28 charges up to the threshold level of NOR gate 29, approximately 4.5 volts (half the supply voltage). Then NOR gate 29 changes state, driving test interval buss 16 "low", changing the state of NOR gate 15 to "high" at its output, turning off transistors 3 and 4, and FET 9, thus removing the supply voltages from rails 5 and 10.

FIG. 2 shows LED 44 mounted on circuit board 48 which is fastened to jack 23, positioned so that LED 44 is readily observed through the ¼" opening of jack 23 when the audio plug is removed to turn preamplifier 6 off. Locating the LED in this manner allows this invention to be incorporated into a guitar without altering its external appearance and styling in any way, and also shields the LED from extraneous light.

Diode 27 serves to reset the timing circuit by discharging capacitor 28 each time the amplifier is turned on, to ensure the correct test interval timing even after a brief period of operation.

Capacitors 2 and 8, each 0.1 uF, serve to bypass batteries 1 and 7 to ensure proper amplifier performance unaffected by battery resistance variations.

Capacitor 45 bypasses interference and noise which could otherwise cause erratic turnon or turnoff.

The function of FET 9 could be performed by an NPN Darlington transistor, with appropriate selection of resistance values for resistors 11 and 12.

Typical component values and types:

| Resistors: | 43 | 680 ohms |
|---|---|---|
| | 33 | 5.6k ohms |
| | 14 | 10k ohms |
| | 13, 19 | 100k ohms |
| | 11, 12, 31, 32, 39, 40, 42 | 220k ohms |
| NOR gates 15, 29, Inverter 25: MOS IC type 4001 | | |
| (for Inverter 25, both inputs connected together) | | |
| Comparators 30, 35, 38 and 41: TTL IC type LM339 | | |
| 2.5 Volt Reference Device 34: LM336Z | | |
| Transistors 3, 4: MPSA55 | | |
| FET 9: N-channel type VN10KM | | |
| Jack 23: Switchcraft 112A | | |

The utility of this invention is applicable to many different types of battery operated appliances, instruments and the like, and the invention is susceptable of numerous variations, alternatives and modifications by those skilled in the art of electronics, without departing from the spirit of the invention. All such variations, alternatives and modifications are intended to fall within the scope of this invention.

What is claimed is:

1. In a battery-operated appliance, a battery condition indicating system comprising,
   (a) an electronic relay circuit having a power input terminal connected to a battery, a power output terminal connected to a power input terminal of the appliance, and a control input terminal,
   (b) a test interval timing circuit having a control input terminal connected to one of a pair of on-off contacts, a control output terminal connected to the control input terminal of said electronic relay circuit, and a timing output terminal supplying a test interval pulse signal, whereby actuating the on-off contacts for turn-on causes said electronic relay circuit to connect the battery to the appliance, and actuating the on-off contacts for turn-off causes said electronic relay circuit to disconnect the appliance from the battery, after a delay timed by the duration of the test interval pulse signal, (c) comparator means for comparing the voltage of the battery with a fixed reference voltage, said comparator means supplying an output signal, enabled during the duration of the test interval pulse signal, the comparator output signal signifying the comparison result, and (d) indicator means driven by and responsive to the output signal of said comparator means, whereby the condition of the battery is communicated to a user during the duration of the test interval pulse signal, from indication of the comparison result by said indicator means.

2. The invention as defined in claim 1 wherein said electronic relay circuit comprises a PNP switching transistor having an emitter connected to the power input terminal, a collector connected to the power output terminal, and a base connected thru a resistor to the control input terminal of said electronic relay circuit.

3. The invention as defined in claim 1 wherein said indicator means comprises a light-emitting diode.

4. In an electric guitar equipped with a battery-operated electronic preamplifier, having a first battery with its negative terminal connected to common ground and a second battery with its positive terminal connected to common ground, a battery condition indicating system comprising, (a) a first electronic relay circuit having a power input terminal connected to the positive terminal of the first battery, a power output terminal connected to a first power input terminal of the preamplifier, and a control input terminal, (b) a second electronic relay circuit having a power input terminal connected to the negative terminal of the second battery, a power output terminal connected to a second power input terminal of the preamplifier, and a control input terminal, (c) coupling means connected between the control input terminal of said first electronic relay circuit and the control terminal of said second electronic, whereby said first electronic relay circuit and said second electronic relay circuit are caused to operate in tandem in response to a control signal applied to the control input terminal of said first electronic relay circuit, (d) a test interval timing circuit having a control input circuit, a control output circuit connected to the control input terminal of said first electronic relay circuit, and a timing output terminal supplying a test interval pulse signal, (e) a pair of on-off contacts, one being connected thru a resistor to the control input of said test interval timing circuit, the other being connected thru a resistor to common ground, (f) a reference voltage circuit having an output terminal supplying a reference voltage during at least the duration of the test interval pulse signal, (g) a first comparator circuit having
a first input terminal receiving a voltage derived from the first battery,
a second input terminal receiving the reference voltage from said reference voltage circuit, and
an output terminal whose conductive state signifies the polarity of any voltage difference between the first and second input terminals of said first comparator circuit, (h) a second comparator circuit having
a first input terminal receiving the sum of a voltage derived from the second battery and a voltage derived from said reference voltage circuit,
a second input terminal connected to common ground, and
an output terminal whose conductive state signifies the polarity of any voltage difference between the first and second input terminals of said second comparator circuit, (i) a light-emitting device connected to a driver circuit controlled by a combination of the first comparator circuit and the second comparator circuit, whereby said light-emitting device becomes energized to emit light whenever the voltage of the first battery and the voltage of the second battery both exceed a predetermined test threshold level as calibrated by the voltage level of the reference voltage circuit.

5. The invention as defined in claim 4 wherein said first electronic relay circuit comprises a PNP switching transistor having an emitter element connected to the power input terminal, a collector element connected to the power output terminal, and a base element connected thru a resistor to the control input terminal.

6. The invention as defined in claim 4 wherein said second electronic relay circuit comprises a field-effect transistor having a source element connected to the power input terminal, a drain element connected to the power output terminal, a gate element connected thru a resistor to the control input terminal of said second electronic relay circuit, and a resistor connected between the gate element and the source element;

and wherein said coupling means comprises a PNP sitching transistor having an emitter element connected to the positive terminal of the first battery, a base element connected thru a resistor to the control input terminal of said first electronic relay circuit, and a collector element connected connected to the control input terminal of said second electronic relay circuit.

7. In an electric guitar equipped with a battery-operated electronic preamplifier, having a first battery with its negative terminal connected to common ground and a second battery with its positive terminal connected to common ground, a battery condition indicating system comprising, (a) a first electronic relay circuit having a power input terminal connected to the positive terminal of the first battery, a power output terminal connected to a first power input terminal of the preamplifier, and a control input terminal, (b) a second electronic relay circuit having a power input terminal connected to the negative terminal of the second battery, a power output terminal connected to a second power input terminal of the preamplifier, and a control input terminal, (c) coupling means connected between the control input terminal of said first electronic relay circuit and the control terminal of said second electronic, whereby said first electronic relay circuit and said second electronic relay circuit are caused to operate in tandem in response to a control signal applied to the control input of said first electronic relay circuit, (d) a test interval timing circuit having a control input circuit, a control output circuit connected to the control input terminal of said first electronic relay circuit, and a timing output terminal supplying a test interval pulse signal, (e) a pair of on-off contacts, one being connected thru a resistor to the control input of said test interval timing circuit, the other being connected thru a resistor to common ground, (f) a reference voltage circuit having an output terminal supplying a reference voltage during at least the duration of the test interval pulse signal, (g) a first comparator circuit having
 a first input terminal receiving a voltage derived from the first battery,
 a second input terminal receiving a reference voltage,
 and an output terminal whose conductive state signifies the polarity of any voltage difference between the first and second input terminals of said first comparator circuit, (h) a second comparator circuit having
 a first input terminal receiving a voltage derived from the second battery,
 a second input terminal receiving a reference voltage,
 and an output terminal whose conductive state signifies the polarity of any voltage difference between the first and second input terminals of said second comparator circuit, (i) a light-emitting device connected to a driver circuit controlled by a combination of the first comparator circuit and the second comparator circuit, whereby said light-emitting device becomes energized to emit light whenever the voltage of the first battery and the voltage of the second battery exceed a predetermined test threshold level as calibrated by the voltage level of the reference voltage circuit, wherein said test interval timing circuit comprises:

(j) a first NOR gate having
 an output terminal connected to the control input terminal of said first electronic relay circuit,
 a first input terminal connected thru a resistor to the positive terminal of the first battery, and
 a second input terminal, (k) a logic inverter having an input terminal connected to the first input terminal of the first NOR gate, and an output terminal, (l) a second NOR gate having
 a first input terminal connected to the first input terminal of the first NOR gate,
 a second input terminal connected thru a timing resistor to the output terminal of the logic inverter, and
 an output terminal connected to the second input terminal of the first NOR gate, and, (m) a timing capacitor connected between the second input terminal of the second NOR gate and common ground.

8. The invention as defined in claim 7 wherein said reference voltage circuit comprises an integrated circuit reference voltage device having a first terminal connected to common ground and a second terminal connected thru a resistor to a voltage source circuit.

9. The invention as defined in claim 8 wherein the voltage source circuit comprises an integrated comparator device having a control input terminal connected to the timing output terminal of said test interval timing circuit, whereby power will be supplied to the voltage reference device only during the duration of the test interval pulse signal.

10. The invention as defined in claim 7 wherein said first comparator circuit comprises an integrated comparator device having
 an inverting input connected to common ground,
 a non-inverting input connected thru a first resistor to the first power input terminal of the preamplifier and thru a second resistor to the output terminal of said reference voltage circuit, and
 an output configured as a collector of an NPN transistor, and wherein said second comparator circuit comprises an inverting input connected thru a first resistor to common ground and thru a second resistor to the second power input of the preamplifier,
 a non-inverting input connected to the output terminal of said reference voltage circuit, and
 an output configured as a collector of an NPN transistor, wherein the output of said first comparator circuit and the output of said second comparator circuits are connected together, and are connected thru a resistor to the timing output terminal of said test interval timing circuit, whereby, during the duration of the test interval pulse signal, the voltage of each of the two batteries is tested by comparison with a threshold test level, predetermined thru design values allocated to the reference voltage and the resistors connected to the inputs of the two comparators, and whereby, whenever the voltage of either battery falls below the test threshold level, the corresponding comparator output is held near zero volts to signify a failed test, but whenever the voltages of both batteries exceeds the test threshold level, then both comparator outputs become open collector circuits, and both comparator outputs are pulled up to a positive voltage level by the collector load resistor to signify a passed battery condition test.

11. The invention as defined in claim 7 wherein said driver circuit comprises an integrated comparator circuit having
 a first input terminal connected directly to the output terminal of said first comparator circuit and also connected directly to the output terminal of said second comparator circuit,
 a second input terminal receiving a bias voltage from the junction of two resistors connected in series to form a voltage divider connected between common ground and the first power input terminal of the preamplifier, and
 an output terminal connected thru a resistor to said light-emitting device.

12. The invention as defined in claim 11 wherein said light-emitting device is a light-emitting diode having an anode element connected to common ground and a cathode element connected thru the resistor to the output terminal of said driver circuit.

13. The invention as defined in claim 7 wherein said pair of on-off contacts comprise part of an audio output jack wherein one of the contacts, forming the tip contact of the audio output jack, is connected thru a capacitor to an audio output terminal of the preamplifier, the audio output jack being mechanically configured such that inserting a matching plug causes said pair of on-off contacts to become open-circuited, but removing the plug causes the contacts to become closed-circuited, whereby inserting the plug is made to apply power to the preamplifier thru said first and second electronic relays, and removing the plug initiates a timed test interval followed by turnoff of the preamplifier.

14. The invention as defined in claim 13 wherein said light-emitting device is located within an electric guitar body, in the proximity of the audio output jack whereby said light-emitting device is visible thru an opening provided by the audio output jack when the plug is removed.

15. In an electric guitar equipped with a battery-operated electronic preamplifier, having a first battery with its negative terminal connected to common ground and a second battery with its positive terminal connected to common ground, a battery condition indiciating system comprising,
 (a) a first electronic relay circuit having a power input terminal connected to the positive terminal of the first battery, a power output terminal connected to a first power input terminal of the preamplifier, and a control input terminal,
 (b) a second electronic relay circuit having a power input terminal connected to the negative terminal of the second battery, a power output terminal connected to a second power input terminal of the preamplifier, and a control input terminal,
 (c) coupling means connected between the control input terminal of said first electronic relay circuit and the control terminal of said second electronic, whereby said first electronic relay circuit and said second electronic relay circuit are caused to operate in tandem in response to a control signal applied to the control input terminal of said first electronic relay circuit,
 (d) a test interval timing circuit having a control input circuit, a control output circuit connected to the control input terminal of said first electronic relay circuit, and a timing output terminal supplying a test interval pulse signal,
 (e) a pair of on-off contacts, one being connected thru a resistor to the control input of said test interval timing circuit, the other being connected thru a resistor to common ground,
 (f) a reference voltage circuit having an output terminal supplying a reference voltage during at least the duration of the test interval pulse signal,
 (g) a first comparator circuit having:
  a first input terminal receiving a voltage derived from the first battery,
  a second input terminal receiving the reference voltage from said reference voltage circuit, and
  an output terminal whose conductive state signifies the polarity of any voltage difference between the first and second input terminals of said first comparator circuit,
 (h) a second comparator circuit having
  a first input terminal receiving the sum of a voltage derived from the second battery and a voltage derived from said reference voltage circuit,
  a second input terminal connected to common ground, and
  an output terminal whose conductive state signifies the polarity of any voltage difference between the first and second input terminals of said second comparator circuit,
 (i) a light-emitting device connected to a driver circuit controlled by a combination of the first comparator circuit and the second comparator circuit, whereby said light-emitting device becomes energized to emit light whenever the voltage of the first battery and the voltage of the second battery both exceed a predetermined test threshold level as calibrated by the voltage level of the reference voltage circuit,
said reference voltage circuit comprising an integrated circuit reference voltage device having a first terminal connected to common ground and a second terminal connected thru a resistor to a voltage source circuit comprising an integrated comparator device having a control input terminal connected to the timing output terminal of said test interval timing circuit, whereby power will be supplied to the reference voltage device only during the duration of the test interval pulse signal,
 said driver circuit comprising:
  an integrated comparator circuit having a first input terminal connected directly to the output terminal of said first comparator circuit and also connected directly to the output terminal of said second comparator circuit,
  a second input terminal receiving a bias voltage from the junction of two resistors connected in series to form a voltage divider connected between common ground and said first power input terminal of the preamplifier, and
  an output terminal connected thru a resistor to said light-emitting device which is a light-emitting diode having an anode element connected to common ground and a cathode element connected thru the resistor to the output terminal of said driver circuit,
 said pair of on-off contacts comprising part of an audio output jack wherein one of the contacts, forming the tip contact of the audio output jack, is connected thru a capacitor to an audio output terminal of the preamplifier, the audio output jack being mechanically configured such that inserting a matching plug causes the contacts to become closed-circuited, whereby inserting the plug is made to apply power to the preamplifier thru said first and second electronic relays, and removing the plug initiates a timed test interval followed by turnoff of the preamplifier,
 said light-emitting device being located within an electric guitar body, in the proximity of the audio output jack whereby said light-emitting device is visible thru an opening provided by the audio output jack when the plug is removed.

* * * * *